(12) United States Patent  
Chawla et al.

(10) Patent No.: US 9,385,457 B2
(45) Date of Patent: Jul. 5, 2016

(54) CONNECTOR ASSEMBLY AND METHOD

(71) Applicant: Intel Corporation, Santa Clara, CA (US)

(72) Inventors: Gaurav Chawla, San Jose, CA (US); Joshua D Heppner, Chandler, AZ (US); Zhichao Zhang, Chandler, AZ (US); David J. Llapitan, Tacoma, WA (US); Vijaykumar Krithivasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/563,641

(22) Filed: Dec. 8, 2014

(65) Prior Publication Data

US 2015/0249298 A1    Sep. 3, 2015

Related U.S. Application Data

(63) Continuation of application No. 13/711,187, filed on Dec. 11, 2012, now Pat. No. 8,905,794.

(51) Int. Cl.
  *H01R 24/28*   (2011.01)
  *H01R 12/72*   (2011.01)
  *H01R 12/79*   (2011.01)
  *H01R 13/11*   (2006.01)
  *H01R 12/71*   (2011.01)
  *H01L 23/34*   (2006.01)
  *H01R 12/70*   (2011.01)

(52) U.S. Cl.
  CPC .............. *H01R 12/722* (2013.01); *H01L 23/34* (2013.01); *H01R 12/7005* (2013.01); *H01R 12/71* (2013.01); *H01R 12/724* (2013.01); *H01R 12/79* (2013.01); *H01R 13/114* (2013.01)

(58) Field of Classification Search
  CPC ...... H01R 23/725; H01R 23/02; H01R 24/28; H01R 2103/00; F21V 29/004; F21V 2101/02
  See application file for complete search history.

(56) References Cited

U.S. PATENT DOCUMENTS

| 4,201,432 | A | * | 5/1980 | Chalmers ........................ 439/82 |
| 4,746,122 | A | * | 5/1988 | Fitzgerald ................. 273/153 R |
| 5,667,401 | A | * | 9/1997 | Kuwabara et al. ............ 439/405 |
| 6,116,920 | A | * | 9/2000 | Yu et al. .......................... 439/79 |
| 7,500,867 | B1 | * | 3/2009 | Doglio et al. ................. 439/371 |
| 8,905,794 | B2 |  | 12/2014 | Chawla et al. |

(Continued)

OTHER PUBLICATIONS

"U.S. Appl. No. 13/711,187, Non Final Office Action mailed Mar. 18, 2014", 6 pgs.
"U.S. Appl. No. 13/711,187, Notice of Allowance mailed Aug. 4, 2014", 7 pgs.

(Continued)

*Primary Examiner* — Gary Paumen
(74) *Attorney, Agent, or Firm* — Schwegman Lundberg & Woessner, P.A.

(57) ABSTRACT

Connectors and methods to couple packages and dies are shown. Selected examples include plugs and receptacles having two or more terraces with contacts provided along the terraces. Examples of connectors and methods include configurations where the connector is usable with a package including a die coupled along a substrate. In selected examples a heat sink is coupled over the die, and a package includes a side access port between the heat sink and the substrate configured to receive the connector, such as one or more of a plug or receptacle through the side access port.

15 Claims, 10 Drawing Sheets

(56) References Cited

U.S. PATENT DOCUMENTS

2012/0270431 A1* 10/2012 Foltz ................... H01R 13/514
  439/374
2014/0162475 A1    6/2014 Chawla et al.

OTHER PUBLICATIONS

"U.S. Appl. No. 13/711,187, Response filed Jun. 11, 2014 to Non Final Office Action mailed Mar. 18, 2014", 13 pgs.

* cited by examiner

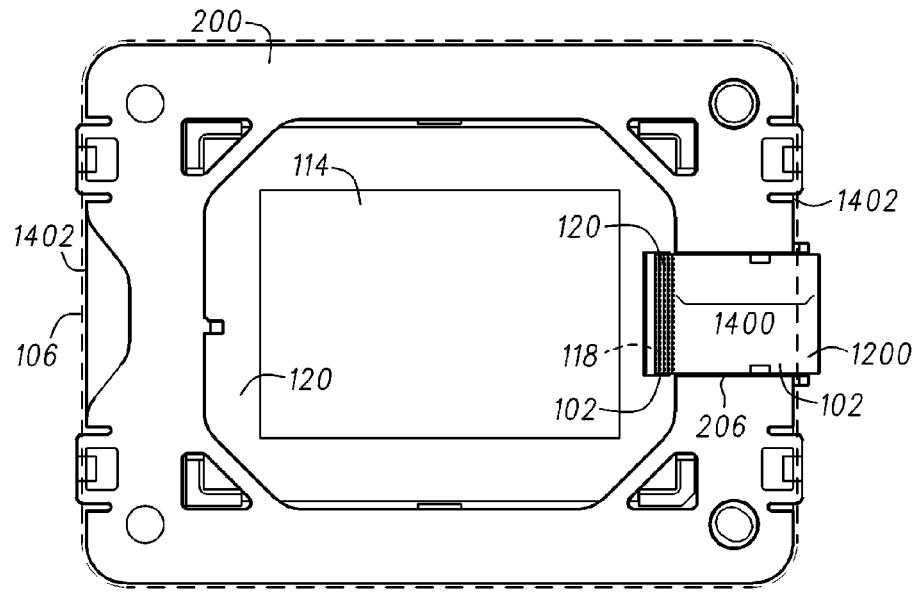
FIG. 14
FIG. 15
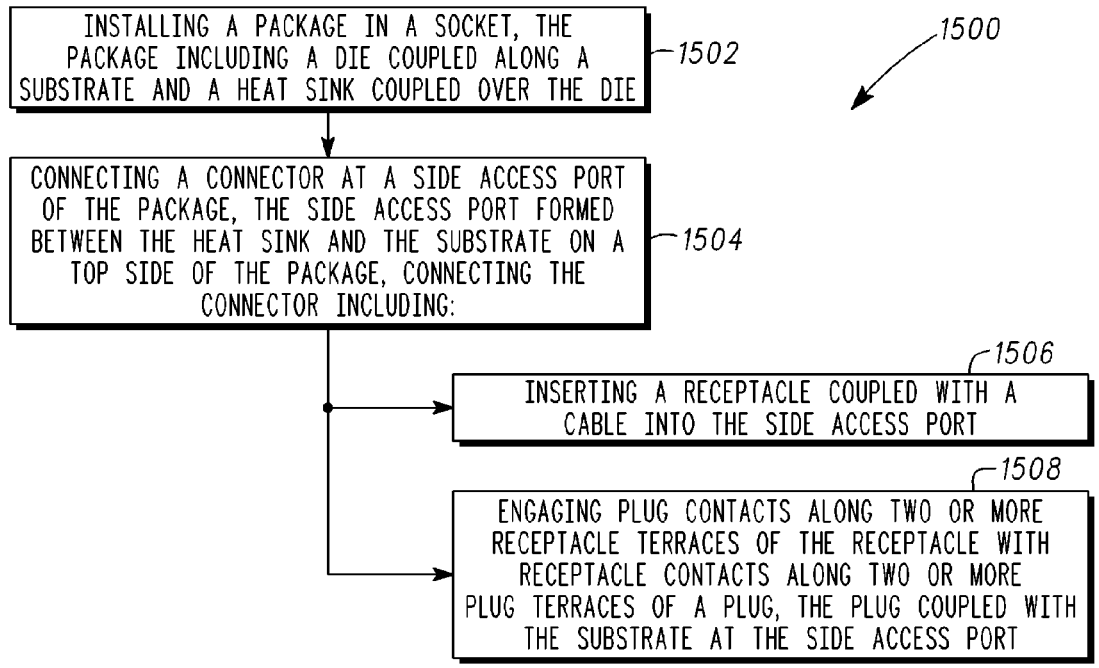

CONNECTOR ASSEMBLY AND METHOD

PRIORITY APPLICATION

This application is a continuation of U.S. application Ser. No. 13/711,187, filed Dec. 11, 2012, which is incorporated herein by reference in its entirety.

TECHNICAL FIELD

Embodiments pertain to interconnects and connector assemblies for the same. Some embodiments relate to topside package connector assemblies that provide high-speed connection between components.

BACKGROUND

One issue with processors is the limited bandwidth of data transmission available through the socket connection of a processor to a motherboard. With increasing processor power the socket connection between the processor and the motherboard is becoming a constraint to otherwise available greater data transmission bandwidth.

Connections other than socket connections provide additional data transmission capability. However, such supplemental connections are limited by the size of the processor and further limited by integrated heat spreaders and heat sinks bonded to the processor. For example, side cable connections extend along their width to provide multiple contacts for data transmission. The limited size of a processor correspondingly limits the size of the cable and the bandwidth for data transmission.

Another issue with processors is the limited access provided to the processor for one or more of aftermarket installation or repair, or during initial assembly. In at least some examples the processor is provided on site or during assembly as a package assembly including the processor bonded to an integrated heat spreader and an overlying heat sink. After installation of the package assembly in a motherboard, additional access (e.g., with cable connections) to the processor is limited. Further, it is undesirable to remove the heat sink from the package because the heat sink is semi-permanently bonded with thermal interface material (TIM) and removal may damage the processor or heat sink. Moreover, the dimensions of the package assembly may be important in space constrained environments, and the removal and rebonding of the heat sink after connection of a data cable may undesirably alter a dimension, such as package height.

Improved device and interconnection designs are desirable that address these and other technical challenges.

BRIEF DESCRIPTION OF THE DRAWINGS

FIG. 14 is a top view of scalable connector and package assembly in accordance with some embodiments;

FIG. 15 is a block diagram of a method of interconnecting a package along a top side of a package in accordance with some embodiments.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
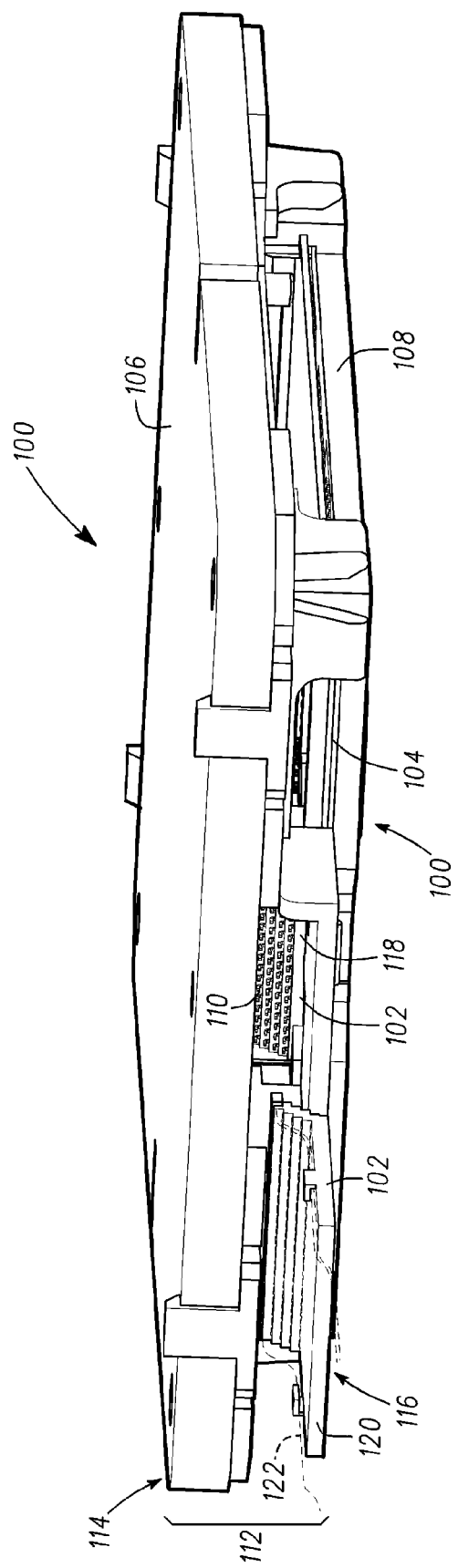
FIG. 1 is a perspective view of a scalable connector and package assembly having top side access in accordance with some embodiments.

FIG. 1 shows one example of a package assembly 100 including a side access port 110 therein. As shown in FIG. 1 the package assembly 100 includes a die 104 and a heat sink 106 over the die. In an example, the die 104, its substrate and an integrated heat spreader coupled over the die 104 from a package. The passage assembly 100 accordingly includes the package (die 104), and the heat sink 106 coupled with a socket 108, such as a socket 108 coupled with a motherboard. As will be described herein below the socket 108 includes a bottom side access port configured to receive a plurality of land side capacitors and further includes sufficient space to accommodate board components. The substrate of the package (substrate of the die 104) includes a contact array on a package bottom side 116 of the die 104 for connection with a circuit board (e.g., a motherboard), for instance by way of intervening contacts on the socket 108.

Referring again to FIG. 1, a connector 102 is shown in an exploded view at the package side 112 of the package assembly 100. In one example, the connector 102 is configured to extend through a side access port 110 formed at the package side 112 for instance on the package top side 114 (the package top side 114 underlies the heat sink 106 and includes the upper surface of the substrate 210 shown below). The connector 102 is in one example a scalable connector including a plug and a receptacle configured to interconnect with one another. As will be described herein, the connector 102 provides a system for connecting the package (e.g., the die 104 and the substrate described herein) by way of a data cable with components of an assembly, such as components on a circuit board. In one example, the connector 102 is scalable, such as by the addition of terraces with contacts thereon to provide sufficient data bandwidth for the package (e.g., a processor) to deliver and received data to and from one or more components without the cable connection being a bottleneck. Additionally, the scalable connector 102 provides a reliable connection between the package and components with minimal loss of signal integrity by way of reliable low insertion force connections between individual contacts. As previously described, the optional bottom side contacts of the die 104 are provided through the socket 108, for instance on a package bottom side 116, and accordingly provide another mechanism for connecting the package with one or more components by direct coupling with a circuit board.

As shown in FIG. 1, the connector 102 includes at least two components including a plug 118 and a receptacle 120. In the example shown the plug 118 is coupled with the die 104 and the receptacle 120 is coupled with a cable 122. In another example the plug 118 and the receptacle 120 are reversed. That is to say, the receptacle 120 is positioned within the side access port 110 and in electrical communication with the die 104. The plug 118 is conversely coupled with the cable 122. Accordingly, a recitation of a plug or receptacle herein (in the specification, claims or the like) is considered to also include the converse. In other words, the recitation of a plug includes the converse receptacle and the recitation of a receptacle likewise includes the plug.

When the plug 118 and the receptacle 120 are coupled to form an assembled connector 102 the cable 122, such as a micro coaxial cable, optical cable or the like, directly couples the die 104 with one or more components, for instance components separately mounted on a motherboard. The direct connection of the components with the die 104 allows for direct coupling of those components without intervening traces, leads and the like extending through the board. The direct coupling allows for greater signal integrity and fewer bandwidth constraints for communication between the die 104 and the one or more components.

Additionally and as will be described herein the side access port 110 and the connector 102 extending there through allow for supplemental connections with the die 104 beyond those provided by the die connection on the package bottom side 116, for instance by a contact array or the like. That is to say, the side access port 110 between the heat sink 106 and a portion of the die 104, such as a substrate, allows for a supplemental connection with the die 104 and accordingly facilitates the use of increased processor power otherwise unavailable with a single connection provided between the die 104 and a circuit board by way of a contact array on the package bottom side 116.

As will also be further described herein the side access port 110 provides access to the die 104 after assembly of the package assembly 100 including the coupling of the heat sink 106 with the die 104. That is to say, for infield installation the side access port 110 allows for coupling of a connector 102 and a cable 122 with one or more components without requiring removal of the heat sink 106 from the die 104.

Figure 2:
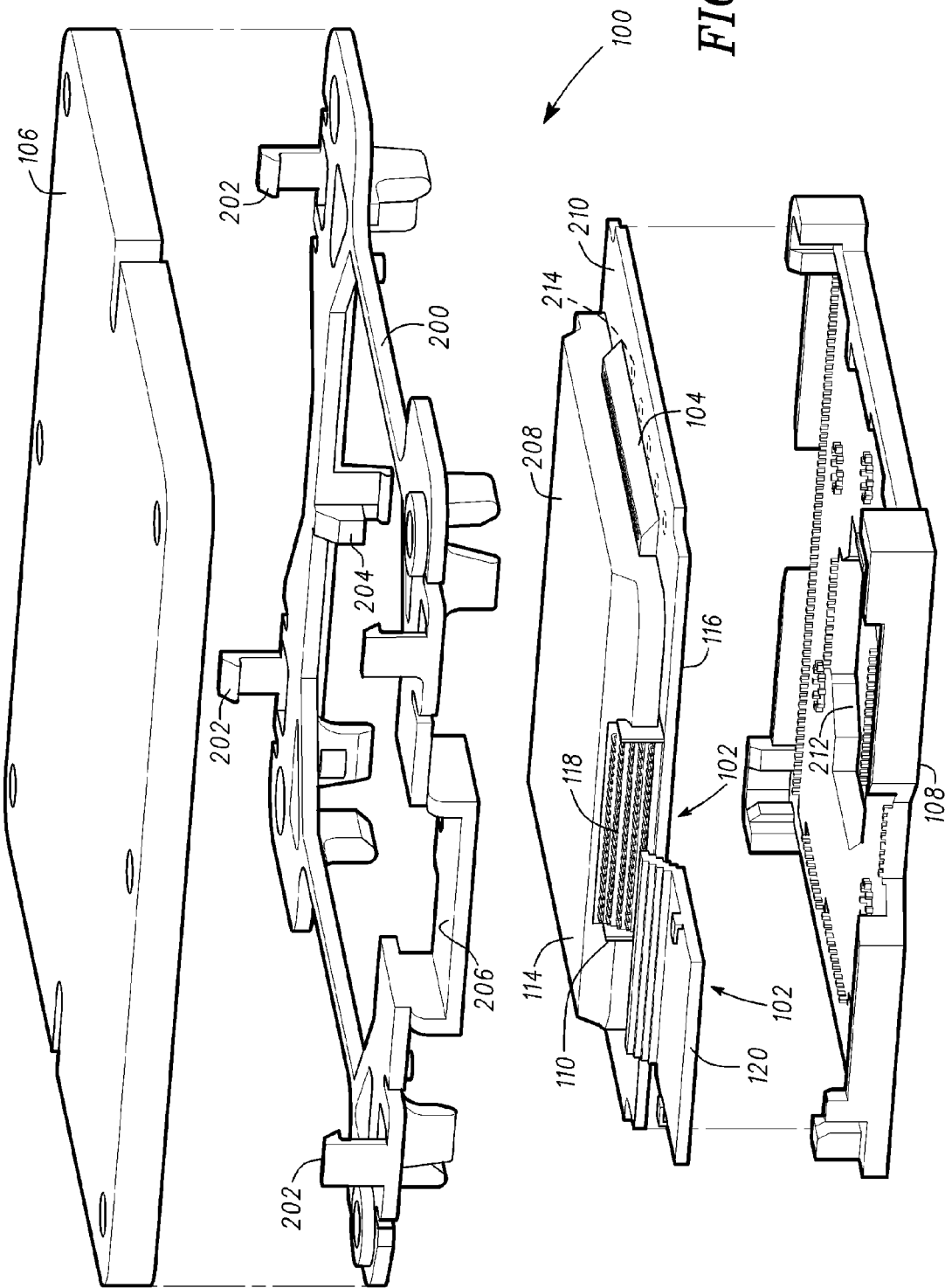
FIG. 2 is an exploded view of the scalable connector and package assembly of FIG. 1.

Referring now to FIG. 2, the package assembly 100 is provided in an exploded view. As shown, the heat sink 106 is above a package clip 200 which in turn is above the package including the die 104 coupled with a substrate 210 (e.g., the package includes the die 104 and the substrate 210). The socket 108 configured to couple the die 104 and substrate 210 with a circuit board is provided beneath the package (e.g., the die 104 and the substrate 210).

The die 104 is coupled along a substrate 210 and an integrated heat spreader 208 is provided over the die 104 (optionally, the package includes the die 104, the substrate 210 and the integrated heat spreader 208). The package clip 200 includes heat sink retaining flanges 202 and substrate retaining flanges 204 that cooperatively connect the heat sink 106 with the substrate 210 of the die 104. For instance, the substrate retaining flanges 204 engage with the substrate 210 and similarly the heat sink retaining flanges 202 engage with and retain the heat sink 106 adjacent to the die 104 (e.g. the integrated heat spreader 208).

As further shown in FIG. 2, the package clip 200 further provides a receptacle guide 206 sized and shaped to guide the receptacle 120 connected with the cable 122 as shown in FIG. 1 into coupling with the plug 118. That is to say, with the limited access provided between the heat sink 106 and the substrate 210 the receptacle guide 206 provides ready access and a guiding and alignment feature to the receptacle 120 (or the plug 118 in a reversed configuration) to the plug (or the receptacle 120 where the components are reversed). Optionally, the receptacle guide 206 cooperates with the space between the heat sink 106 and the substrate 210 to form the side access port 110.

Additionally the receptacle guide 206 guides the receptacle 120 relative to the plug 118 to ensure the proper interfitting of each of the terraces of the receptacle 120 with the plug 118. As shown in FIG. 2 and further shown herein each of the plug 118 and the receptacle 120 includes stepped terraces including a plurality of contacts thereon. The contacts are arranged to interfit as the stepped terraces of each of the plug 118 and the receptacle 120 are engaged. The terraced interface provides a plurality of contacts within the limited space provided by the side access port 110 between the substrate 210 and the heat sink 106.

Referring again to FIG. 2, the socket 108 previously shown in FIG. 1 is provided exploded from the die 104 and the substrate 210 (the package). As shown the socket 108 includes a bottom side access port 212 sized and shaped to pass a contact array 214 on the package bottom side 116 (e.g., having land side capacitors and space to accommodate components on the board). The contact array 214 is sized and shaped to extend through the bottom side access port 212 for coupling with corresponding contacts on a circuit board coupled with the socket 108. Accordingly, with the side access port 110 and the contact array 214 shown in FIG. 2 the package (including the die 104 and the substrate 210) and the connector 102 provide a plurality of connection options for the package.

As will be described in detail herein, the connector 102 with scalable terraces each having a plurality of contacts (e.g., on the plug 118 and the receptacle 12) as shown in FIG. 2 provides a low profile connector 102 sized and shaped to extend through the limited space provided between the heat sink 106 and the substrate 210 to accordingly provide a plurality of contacts for connection with one or more components on the board without requiring removal of the heat sink 106 to couple a cable connector or the like to the die 104 (thereby maintaining the dimensions of the original package assembly 100).

Figure 3:
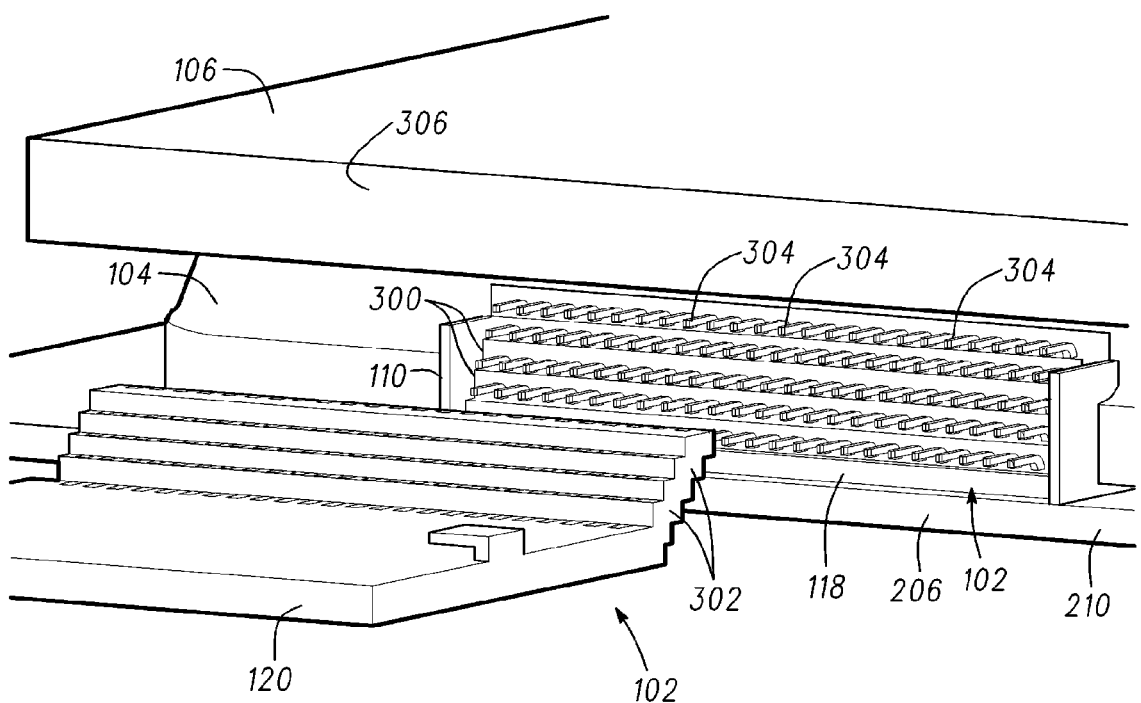
FIG. 3 is a detailed perspective view of the scalable connector including a plug and a receptacle in accordance with some embodiments.

FIG. 3 shows a detailed perspective view of the connector 102 including the plug 118 and the receptacle 210. Referring first to the plug 118 a plurality of plug terraces 300 having a stepped configuration and a plurality of receptacle contacts 304 on each of the terraces is provided on the plug. As shown, the plug terraces 300 and the plug 118 are recessed within the side access port 110 (in one example at least partially formed by the receptacle guide 206).

As further shown in FIG. 3, receptacle terraces 302 are provided on the receptacle 120. In one example, the plurality of receptacle terraces 302 include two or more terraces having a corresponding configuration to the plug terraces 300. As will be described herein, the receptacle terraces 302 in one example include a corresponding arrangement and number of plug contacts sized and shaped for engagement with the receptacle contacts 304. The guided insertion of the receptacle 120 by the receptacle guide 206 aligns the receptacle terraces 302 with the plug terraces 300. The receptacle contacts 304 of the plug terraces 300 and the plug contacts of the receptacle terraces 302 are similarly guided to ensure the proper interfitting of each of the respective contacts of the plug 118 and the receptacle 120. The guiding of the receptacle 120 into engagement with the plug 118 is possible with this arrangement even with the limited space provided between the heat sink 106 and the substrate 210. Stated another way and referring again to FIG. 2, the receptacle guide 206 as well as the corresponding surfaces of the substrate 210 and the heat sink 106 in at least one example cooperate to provide guiding surfaces for the connector 102 including one or more of the receptacle 120 or the plug 118 (if reversed) for an aligned connection between the plug terraces 300 and the receptacle terraces 302 as well as their respective contacts.

Referring again to FIG. 3 the heat sink 106 is shown positioned above the connector 102 and the side access port 110. The heat sink 106 has an expanded perimeter relative to the die 104 (see FIG. 2). That is to say, the heat sink 106 has a heat sink overhang 306 relative to the die 104 and the corresponding portion of the plug 118 coupled with the die. With the coupling of the heat sink 106 to the die 104 as shown in FIG. 1 the accessibility of a side access port of the die 104 is limited. For instance, as shown in FIG. 2 the side access port 110 is recessed relative to the enlarged perimeter of the heat sink 106. With the connector 102 shown in FIGS. 1, 2 and 3 a receptacle such as the receptacle 120 is configured for positioning between the heat sink 106 and the substrate 210 shown in FIG. 2. The receptacle 120 is connectable with the plug 118 despite the heat sink overhang 306 shown in FIG. 3. Further, the receptacle 120 with its plurality of terraces 302 and plug contacts is able to provide a connection with the plug 118 having the corresponding terraces 300 and receptacle contacts 304. That is to say, despite the small space provided between the heat sink 106 and the substrate 210 as well as the inaccessibility provided by the expanded perimeter of the heat sink 106 the scalable connector 102 (e.g., a low profile stepped connector with rows of contacts) is able to readily connect the receptacle 120 with the plug 118 and also provide a connection with a high data bandwidth.

The stepped configuration of the plurality of plug terraces 300 and the receptacle terraces 302 allows for the scalability of contacts such as the plug contacts and receptacle contacts 304 shown in FIG. 3. That is to say, with a connector configuration having a single row a set number of contacts are provided for that row. By multiplying the rows, for instance by way of adding additional recessed and stepped plug terraces 300 and receptacle terraces 302 the corresponding number of contacts of the connector 102 is multiplied relative to those provided with a single row. The connector 102 shown in FIGS. 1 and 3 is thereby able to provide a scalable number of contacts according to the number of plug and receptacle terraces 300, 302.

Figure 4:
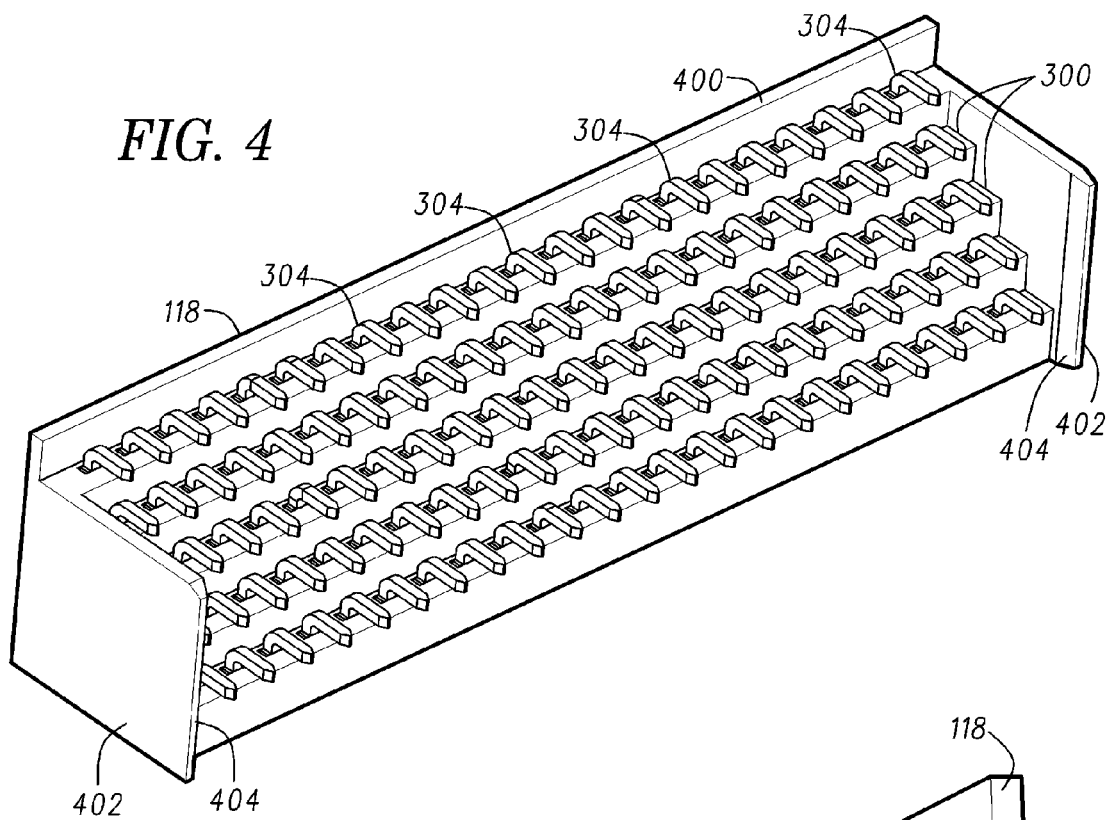
FIG. 4 is a perspective view of the plug in accordance with some embodiments.

Referring now to FIG. 4, the plug 118 is shown in perspective. The plug 118 includes a plug body 400 and one or more alignment flanges 402 optionally provided at either end of the plug body 400. As previously described, the plug 118 includes two or more plug terraces 300 having a corresponding set of receptacle contacts 304 provided on each of the terraces 300. The terraces 300 are provided in a corresponding configuration to a number of receptacle terraces 302 provided on the receptacle 120.

Referring again to FIG. 4, the alignment flanges 402 in one example are provided near the ends of the plug body 400. Optionally, the alignment flanges 402 include one or more guide bevels 404. The alignment flanges 402 cooperate with the receptacle 120 to guide the receptacle and its plurality of receptacle terraces 302 into corresponding engagement with the plug terraces 300 of the plug 118. For instance, the receptacle 120 is fit through the side access port 110 shown in FIGS. 1 and 2 and then engages the alignment flanges 402 immediately before coupling between the plug terraces 300 and the receptacle terraces 302 begins. The alignment flanges 402 include dimensions (e.g., such as the length of the space between the flanges) corresponding to those of the receptacle 120 to ensure that the receptacle terraces 302 are accurately and precisely delivered into engagement with the plug terraces 300 so that the receptacle contacts 304 of the plug 118 are engaged with the corresponding plug contacts of the receptacle 120.

Figure 5:
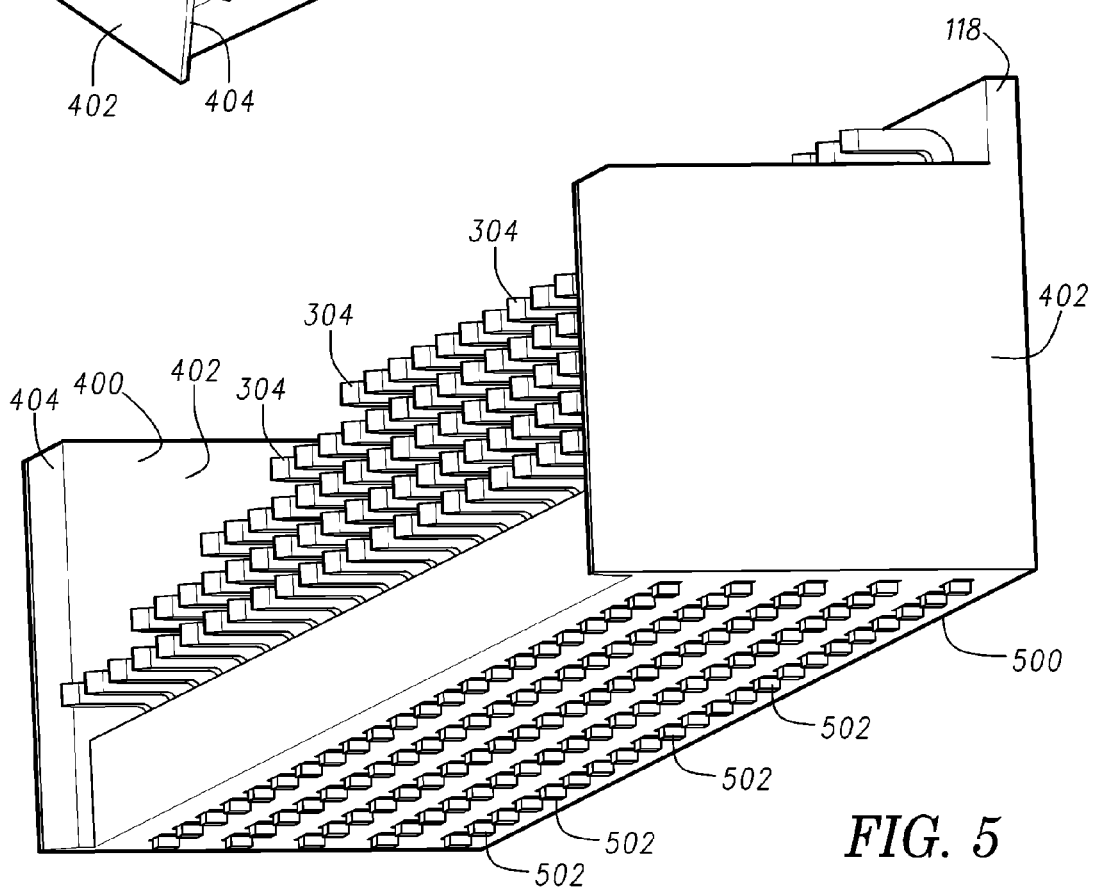
FIG. 5 is a perspective bottom view of the plug in accordance with some embodiments.

FIG. 5 shows a bottom perspective view of the plug 118. As shown the plug body 400 includes a substrate planar mounting surface 500 in one example. The substrate planar mounting surface 500 provides a planar surface for the reception and presentation of a plurality of substrate contacts 502 corresponding to the plurality of receptacle contacts 304 previously described herein. The plurality of receptacle contacts 304 extend through the plug body 400 (e.g., by way of plug pins including the contacts 304, 502) to the corresponding substrate contacts 502. The substrate contacts 502 are engaged with corresponding contacts of the die for instance along the substrate 210 shown in FIG. 2. The substrate planar mounting surface 500 thereby provides a planar surface that facilitates easy connection between the plurality of substrate contacts 502 of the plug 118 having the plurality of plug terraces 300 and a corresponding number and arrangement of contacts on the substrate 210.

Figure 6:
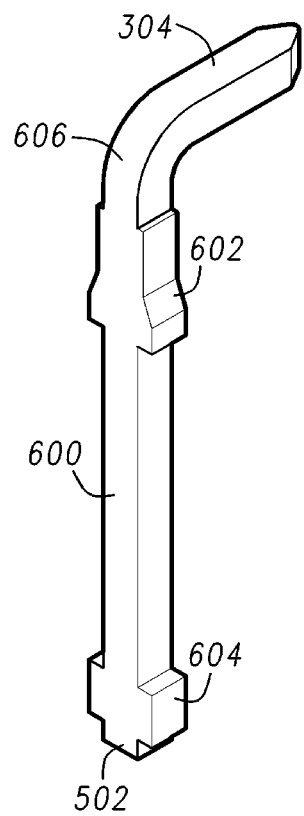
FIG. 6 is a perspective view of a plug pin in accordance with some embodiments.
Figure 7:
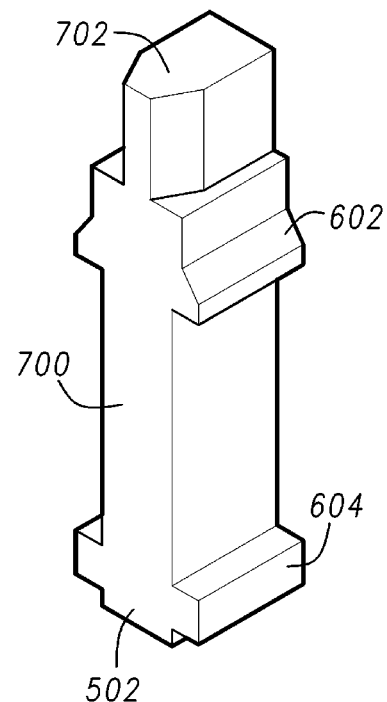
FIG. 7 is a perspective view of another plug pin in accordance with some embodiments.

FIGS. 6 and 7 show two examples of plug pins 600, 700 useable with the plug body 400 of the plug 118 previously described herein. In the first example shown in FIG. 6, the plug pin 600 has an angled configuration including an elbow 606. Additionally, the plug pin 600 includes one or more anchors 602, 604 sized and shaped to hold the plug pin 600 in a static position within the plug body 400. In one example, the anchor 602 is provided adjacent to the elbow 606 and the receptacle contact 304. While the anchor 602 is engaged with the plug body 400 for instance by a process of stitching (interference fitting), molding or the like the anchor 602 provides support for the elbow 606 and the receptacle contact 304 for instance as the receptacle contact 304 is received within a corresponding plug contact of the receptacle 120. Additionally, the anchor 604 provides similar support to the substrate contact 502 of each of the plug pins 600 as the substrate contact 502 is engaged with a corresponding contact of the substrate 210. The anchors 602, 604 cooperate to reliably hold the contacts in place and thereby ensure accurate reception with corresponding contacts on the substrate 210 and in the receptacle 120.

Referring now to FIG. 7, another example of a plug pin 700 having a linear configuration is provided. In a similar manner to the plug pin 600 the plug pin 700 includes first and second anchors 602, 604. The first anchor 602 provides support to the receptacle contact 702 extending in a vertical fashion from the remainder of the plug pin 700. In a similar manner to the anchor 604 of the plug pin 600 the anchor 604 of the plug pin 700 provides support to the substrate contact of the linear plug pin 700. Additionally and with regard to each of these examples the anchors 602, 604 provide for a static anchoring of the plurality of plug pins 600, 700 within the plug body 400 of the plug 118. The corresponding receptacle contacts 304 and substrate contacts 502 are thereby held in a tight aligned configuration to accordingly present an array of contacts whether on the substrate planar mounting surface 500 shown in FIG. 5 or on the plug terraces 300 shown in FIG. 4 for corresponding electrical communication with the arranged contacts of the receptacle 120 or the substrate 210 respectively.

Figure 8:
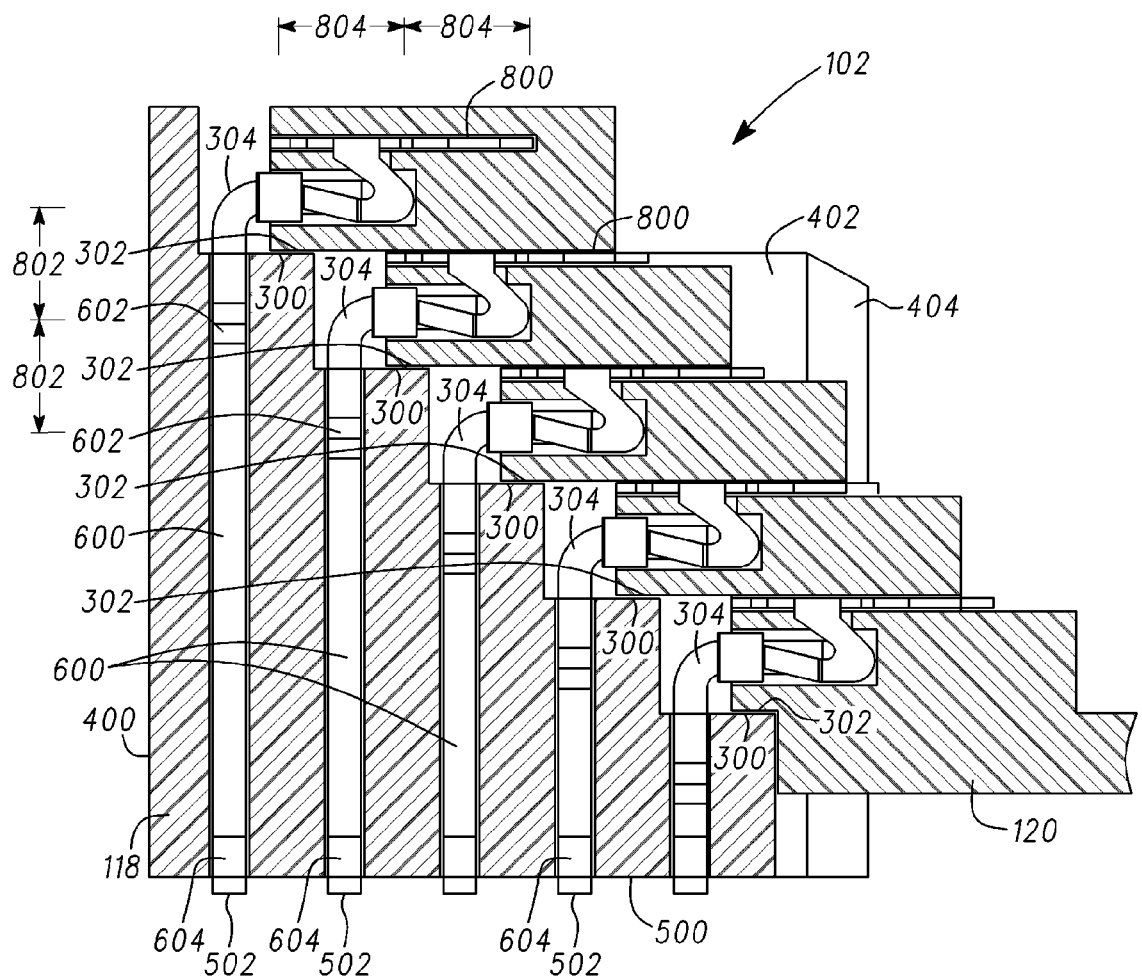
FIG. 8 is a cross sectional view of the plug and the receptacle in an assembled configuration.

FIG. 8 shows the connector 102 in an assembled configuration with the plug 118 coupled with the receptacle 120. The plug and the receptacle 118, 120 are shown in a cross-sectional configuration thereby exposing the plug pin, such as the angled pin 600 shown in FIG. 6, engaged with corresponding plug contacts 800 of a receptacle pin further described herein. As shown in FIG. 8 the plurality of receptacle contacts 304 are received and coupled with a corresponding plurality of plug contacts 800. The receptacle contacts 304 and the plug contacts 800 are provided in a stepped configuration for instance in rows along each of the respective plug terraces 300 and receptacle terraces 302. The interfitting relationship of the plug terraces 300 relative to the receptacle terraces 302 is shown in FIG. 8. Stated another way, the plug 118 and the receptacle 120 are shown in an interfitted relationship according to the matching configuration of the plurality of plug terraces 300 and receptacle terraces 302 that arrange the corresponding plurality of plug contacts 800 and receptacle contacts 304 in one or more rows. The staggered relationship of the plurality of plug terraces 300 and receptacle terraces 302 assist in the accurate positioning and alignment to achieve corresponding mechanical engagement and electrical communication between each set of contacts for each of the plug terraces 300 and the receptacle terraces 302, respectively.

As further shown in FIG. 8, the plurality of plug pins 600 are arranged in a staggered formation having a horizontal contact pitch 804. The plurality of receptacle contacts 304 of the plug pins 600 of each of the plug terraces 300 are staggered according to the horizontal contact pitch 804. Orientation of the contacts in this staggered (stepped) manner allows for recessing of the corresponding recessed plug terraces 300 as well as the respective receptacle terraces 302. In another example and as shown in FIG. 8, the plurality of receptacle contacts 304 are staggered with a vertical contact pitch 802. The plurality of receptacle contacts 304 are staggered in this fashion to ensure the plurality of plug terraces 300 may be arranged vertically relative to one other without requiring lateral staggering of the plug pins such as the plug pin 600 shown in FIG. 8 (i.e., lateral staggering into and out of the page). Stated another way, if the plurality of receptacle contacts 304 were arranged with a horizontal or vertical contact pitch 804, 802 approaching zero each of the plurality of receptacle contacts 304 would be positioned directly on top of one another, and the plug pins 600 would necessarily require staggering into and out of the page to allow for room for each of the receptacle contacts 304.

In contrast, with the configuration shown in FIG. 8 with the horizontal and vertical contact pitches 804, 802 the plurality of plug pins 600 are staggered from left to right (as shown on the page) thereby allowing each of the respective receptacle contacts 304 in two or more terraces 300 to reside above or below one another. The provision of the vertical contact pitch 802 to the plurality of receptacle contacts 304 of each of the plug terraces 300 spaces the contacts and ensures that the contacts of each of the terraces 300 are positioned above or below adjacent receptacle contacts 304 according to the pitch 802. That is to say, the vertical and horizontal contact pitches 802, 804 facilitate the staggering of a plurality of receptacle contacts 304 (above and below each other) in the small space provided by the side access port 110 for each of the rows corresponding to the plug terraces 300. Similarly, the plug contacts 800 of the receptacle terraces 302 are similarly staggered in the same manner and for similar reasons. The staggering of the contacts 304, 800 thereby allow for the provision of multiple contacts and corresponding enhanced data bandwidth in the limited amount of space provided by the side access port 110 (FIGS. 1 and 3). The staggering provided by the vertical and horizontal contact pitches 802, 804 similarly positions the contacts of each of the plug 118 and the receptacle 120 in a low profile arrangement that ensures the connector 102 correspondingly has a low (small) profile that fits between the small access provided by the heat sink 106 and the substrate 210 (FIG. 2). Additionally, the horizontal contact pitch 804 and the vertical contact pitch 802 ensure that a plurality of contacts such as the receptacle contacts 804 and the plug contacts 800 are provided with the connector 102 within the limited width of the side access port 110 by providing the contacts in vertically aligned columns crossing each of the receptacle terraces 302 and the plug terraces 300.

Figure 9:
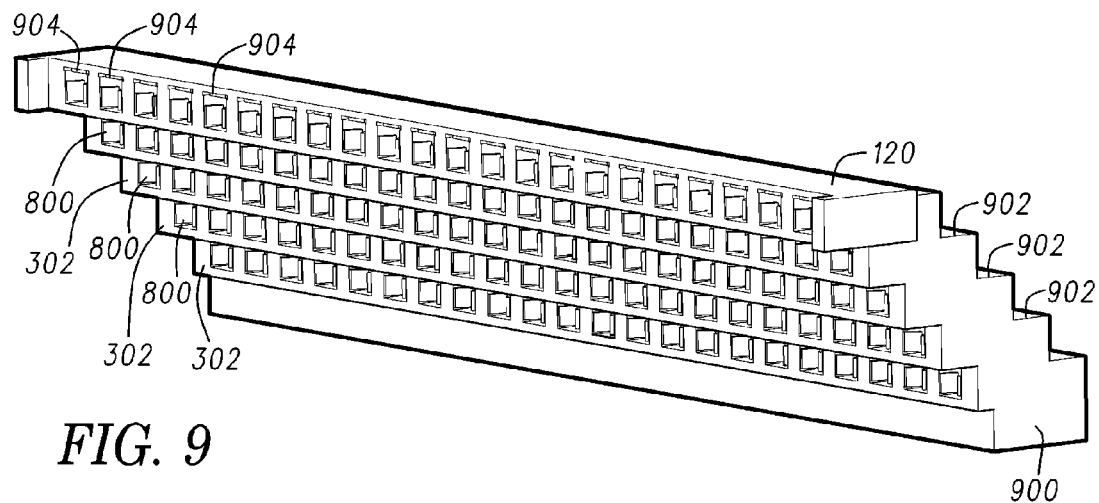
FIG. 9 is a perspective view of the receptacle in accordance with some embodiments.
Figure 10:
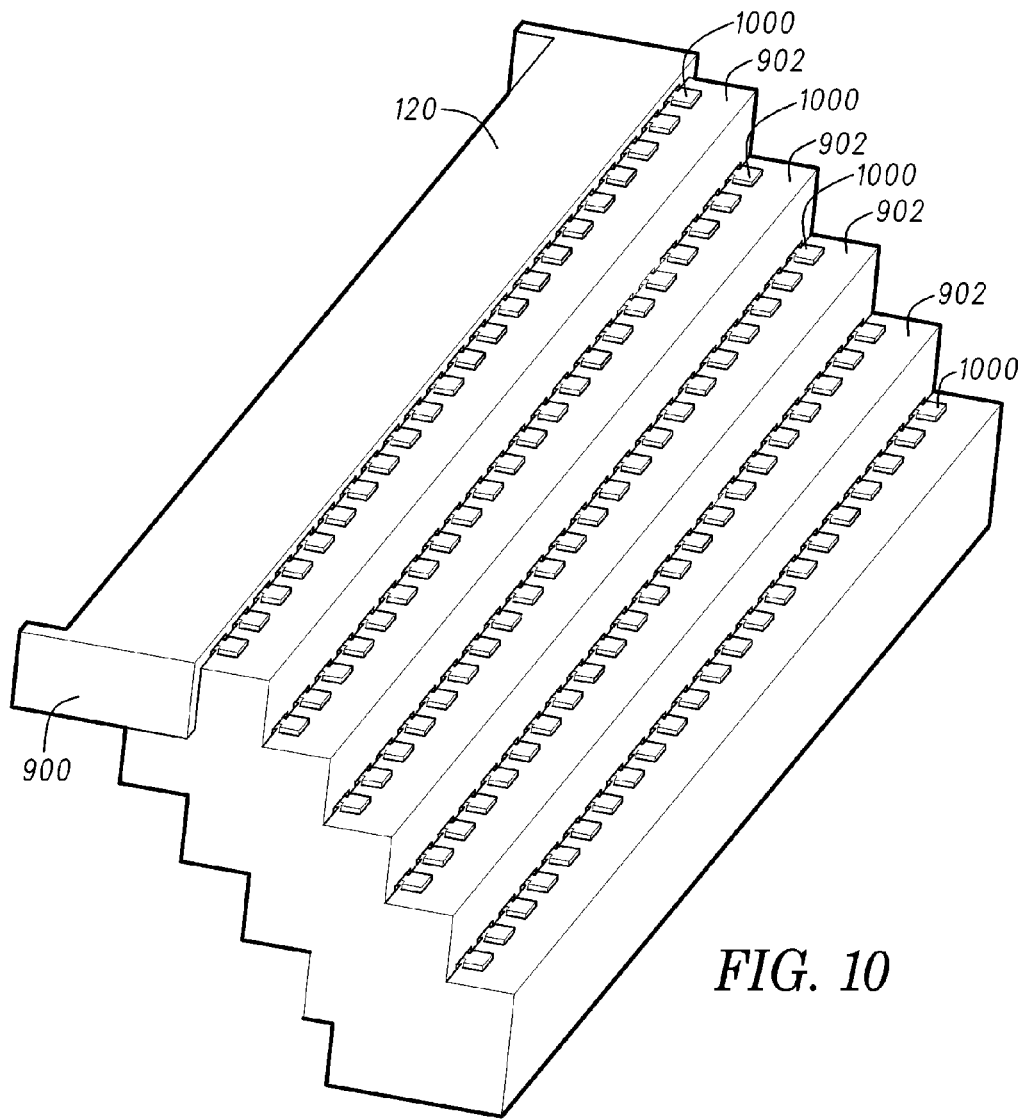
FIG. 10 is a perspective rear view of the receptacle in accordance with some embodiments.

Referring now to FIGS. 9 and 10, one example of the receptacle 120 is provided. The receptacle 120 includes a receptacle body 900 having a plurality of receptacle terraces 302, as previously shown in FIG. 3. In the example shown in FIG. 9, the plug contacts 800 are positioned within plug contact recesses 904 formed in each of the receptacle terraces 302. That is to say, the plug contacts 800 are provided in one or more rows corresponding to the receptacle terraces 302. In one example, the plug contact recesses 904 are sized and shaped to provide the plug contacts 800 therein and allow for at least some amount of deflection of a portion of the plug contacts 800, for instance arms of the plug contacts, to allow for reception of the receptacle contacts 304 therein.

As further shown in FIG. 9 and shown in greater detail in FIG. 10, a plurality of cable support terraces 902 are provided for coupling with one or more layers of a corresponding cable such as the cable 122 shown in FIG. 1 (e.g., a multi-layer cable such as a ribbon cable). Referring now to FIG. 10 the cable support terraces 902 are shown in greater detail and include a plurality of cable contacts 1000 corresponding to the plug contacts 800 shown in FIG. 9. Stated another way, for each of the plug contacts 800 shown in FIG. 9 a corresponding cable contact 1000 is provided at an opposed end of a receptacle pin on each of the cable support terraces 902.

The cable support terraces 902 are optionally staggered in a similar fashion to the receptacle terraces 302 shown in FIG. 3. The staggered cable support terraces 902 provide line of sight to each of the cable contacts 1000 of each of the cable support terraces 902. Accordingly a cable having one or more layers (e.g., a multi-ribbon cable) is applied along each of the cable contacts 1000 for instance along each of the cable support terraces for easy coupling with the cable contacts 1000 along each of the terraces. Stated another way, during assembly of the receptacle 120 with the cable 122 a first layer of the cable 122 is provided for coupling with the rightmost cable support terrace 902 (e.g., by solder connection). After coupling of the first layer of the cable with the rightmost cable support terrace 902 optional second, third, fourth and fifth layers of the cable are subsequently applied to each of the respective cable support terraces 902 (e.g. by soldering, mechanical engagement and the like). The stepped cable support terraces 902 thereby provide ready coupling of the contacts of the cable with the corresponding cable contacts 1000 during assembly of the receptacle 120 with the cable 122.

Figure 11:
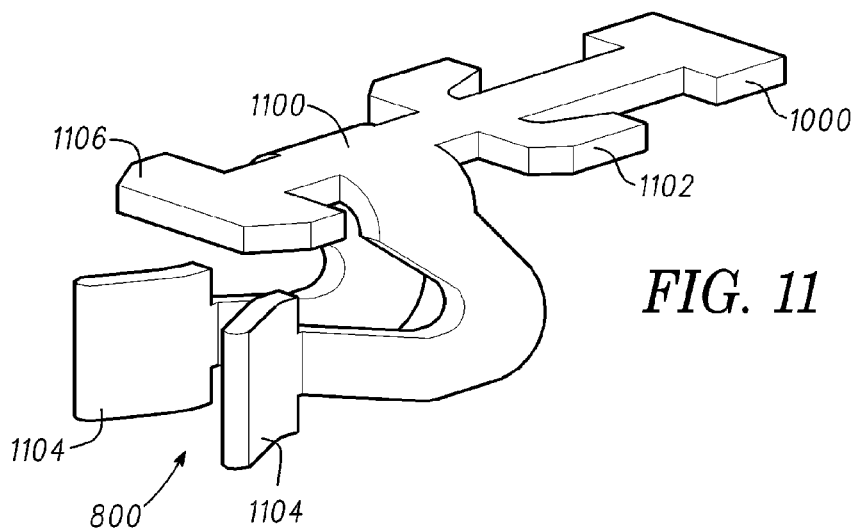
FIG. 11 is a perspective view of a receptacle pin in accordance with some embodiments.

Referring now to FIG. 11, one example of a receptacle pin 1100 is provided. The receptacle pin 1100 shown in the figure includes a plug contact 800 shown in FIG. 8 as well as a cable contact 1000 shown in FIG. 10. As shown, the plug contact 800 is in communication with the cable contact 1000. In one example the plug contact 800 includes one or more female plug contacts such as the female plug contacts 1104 having a prayer arm configuration. The female plug contacts 1104 are configured to deflect relative to the remainder of the receptacle pin 1100 for instance during insertion of the receptacle contact 304 therein. The deflectable nature of the female plug contacts 1104 allows for a low insertion force coupling between the receptacle contacts 304 and the plug contacts 800 of the respective plug 118 and receptacle 120. The deflection and clamping of the receptacle contacts 304 provided by the female plug contacts 1104 provide reliable communication and low signal noise between the contacts This reliable engagement between the contacts is achieved with a low insertion force, for instance an insertion force provided by pushing the receptacle 120 into engagement with the plug 118 as described herein (for instance by engagement and interfitting of the correspondingly arranged plug terraces 300 and receptacle terraces 302 having the corresponding contacts thereon).

In another example shown in FIG. 11, optionally the receptacle pin 1100 includes a second female plug contact 1106. In one example for instance where the receptacle contact includes the receptacle contact 702 of the plug pin 700 shown on FIG. 7 the receptacle contact 702 is engaged between both of the female plug contacts 1104 as well as the female plug contact 1106 to provide supplemental support to the receptacle pin 1100 in the receptacle housing.

The plug pins 600, 700 as well as their corresponding contacts and the receptacle pin 1100 described herein are in one example constructed with, but not limited to, conductive components including but not limited to copper, gold and the like. Further, as provided herein in one example one or more of the plug pins 600, 700 and the receptacle pin 1100 are molded with the corresponding plug body 400 and the receptacle body 900 shown in respective FIGS. 4 and 9. In another example one or more of the plug pins 600, 700 or the receptacle pin 1100 are mechanically engaged with the corresponding plug body 400 and receptacle body 900 for instance by inserting each of the respective pins into the corresponding bodies and utilizing the respective anchors 602, 604 and 1102 to anchor or stitch the pins within those bodies. In still another example, one or both of the plug body 400 and the receptacle body 900 are formed by molding of the bodies as single integral components. Optionally, the bodies 400, 900 are overmolded onto the pins 600, 700, 1100. In another example, the terraces of one or more of the plug 118 and the receptacle 120 are separately formed (e.g., by molding) and then assembled. Accordingly, the plug 118 and the receptacle 120 are scalable at the time of assembly according to the processing needs and dimensions of a particular die 104.

Figure 12:
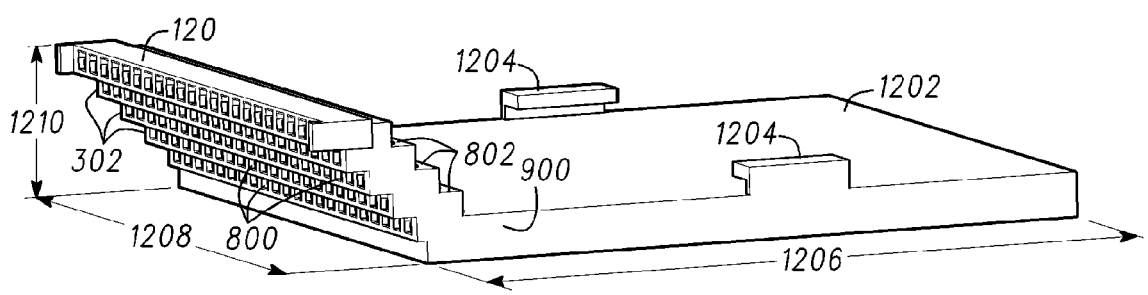
FIG. 12 is a perspective view of another receptacle including a receptacle insertion arm in accordance with some embodiments.

FIG. 12 shows another example of the receptacle 120 including a receptacle insertion arm 1200 extending away from the receptacle body 900. As will be described herein the receptacle insertion arm 1200 provides mechanical assistance to move the receptacle 120 through the side access port 110 (e.g., the receptacle guide 206) beneath an overhanging portion of the heat sink 106 shown in FIG. 2. Stated another way, the receptacle insertion arm 1200 assists in the positioning of the receptacle 120 in a coupling configuration with the plug 118 of the connector 102.

As shown in FIG. 12 the receptacle insertion arm 1200 extends away from the receptacle body 900. In one example, the receptacle insertion arm 1200 includes one or more cable clips 1204 sized and shaped to retain a cable along a cable support surface 1202. As previously described herein, the cable support terraces 902 allow for the individual coupling of ribbon cables with one or more of the cable contacts formed in rows along the cable support terraces 902. The cable clips 1204 in cooperation with the cable support surface 1202 provide a feature to retain the cables along the cable support surface 1202 and minimize stresses at the interface between the cables and the corresponding cable contacts extending along the cable support terraces 902.

The dimensions of the receptacle insertion arm 1200 such as the receptacle length 1206, the receptacle width 1208 and the receptacle height 1210 (of the receptacle body 900) facilitate the positioning as well as the alignment and guidance of the receptacle terraces 302 into coupling with the corresponding plug terraces 300 of the plug 118. That is to say, the receptacle length 1206, the receptacle width 1208 and the receptacle height 1210 are in at least one example dimensioned to engage with and slide along the corresponding surfaces of the receptacle guide 206 (and optional alignment flanges 402 of the side access port 110 to align and guide the receptacle 120 into engagement with the plug 118. Accordingly, the contacts of each of the receptacle 120 and the plug 118 are aligned and interfitted according to the arrangements of the receptacle length, width and height as well as the corresponding dimensions of the side access port 110 (including for instance the receptacle guide 206) and the interfitting of the receptacle terraces 302 with the plug terraces 300.

In one example, the receptacle insertion arm 1200 is molded with the receptacle body 900. In another example the receptacle insertion arm 1200 is a separate component coupled with the receptacle body 900. The receptacle insertion arm 1200 is dimensioned to extend between the substrate 210 and the heat sink 106 shown in FIG. 2 and shown in the assembled configuration of FIG. 1. In one example the receptacle insertion arm 1200 has a length extending at least as long as the heat sink overhang relative to the plug 118 in the side access port 110. Accordingly, handling of the receptacle insertion arm 1200 including insertion of the receptacle 120 according to movement of the receptacle insertion arm 1200 allows for the coupling of the receptacle 120 with the plug 118 by translational movement (e.g., horizontal movement) of the receptacle 120 by way of the insertion arm 1200 into engagement with the plug 118.

In another example, and as previously described herein the configuration of the plug 118 and the receptacle 120 are reversed. In such an orientation the plug 118 is coupled optionally with the insertion arm 1200 shown in FIG. 12 while the receptacle 120 is coupled along the substrate 210 of the die 104. In this arrangement an operator would use the insertion arm 1200 to push the plug 118 into engagement with the receptacle 120 coupled with the die 104 by way of the substrate 210.

Figure 13A:
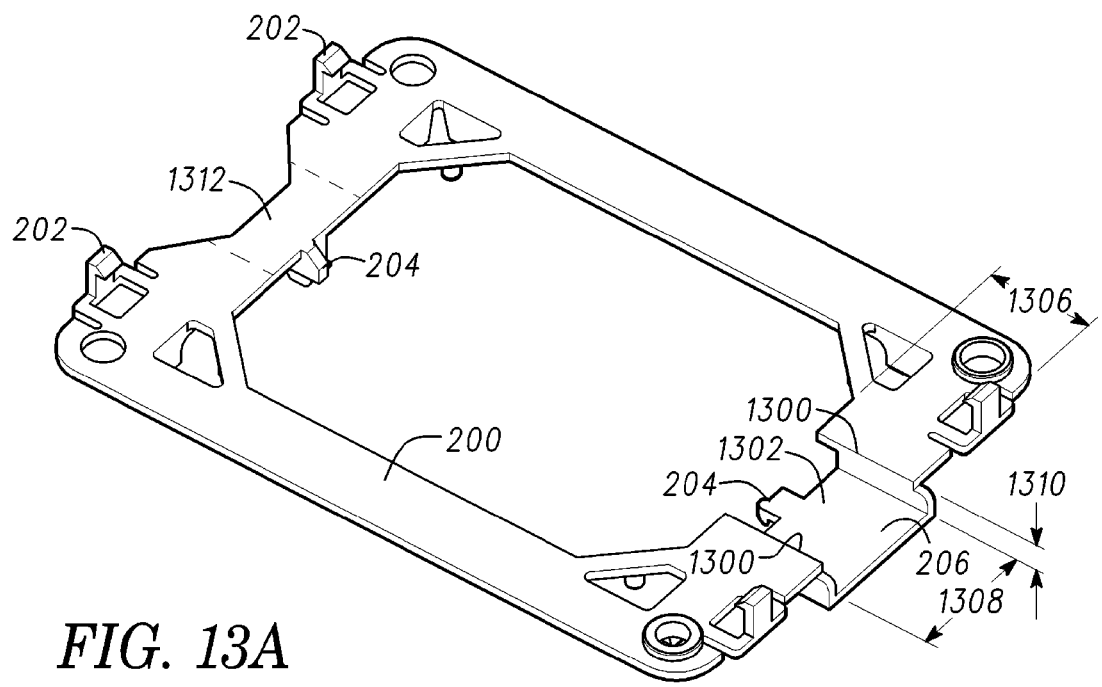
FIG. 13A is a perspective view of a package clip in accordance with some embodiments.
Figure 13B:
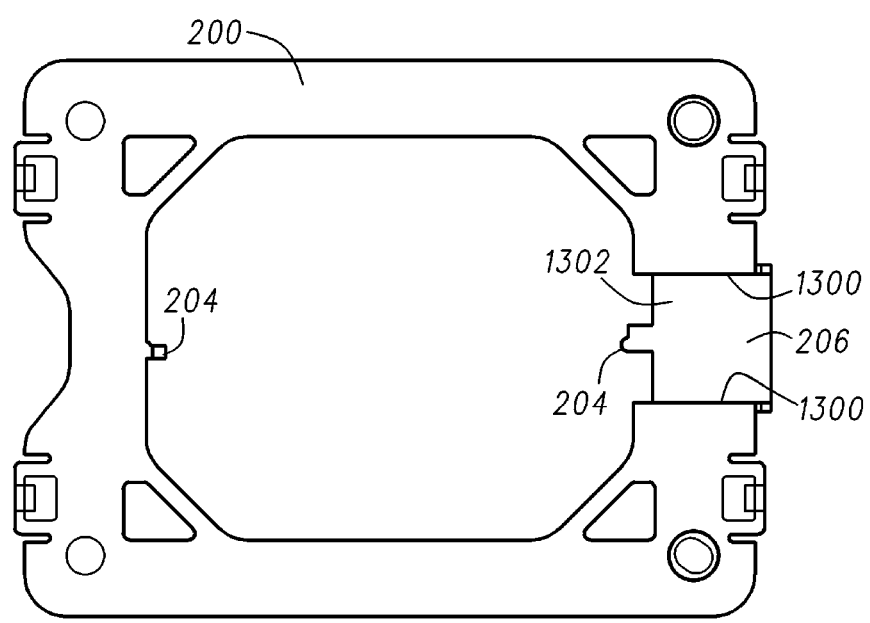
FIG. 13B is a top view of the package clip of FIG. 13A.

FIGS. 13A and 13B show one example of the package clip 200 previously shown in FIG. 2. As previously described, in one example the package clip 200 includes heat sink retaining flanges 202 and substrate retaining flanges 204 each configured for coupling with the corresponding heat sink 106 and the substrate 210 of the die 104 shown in FIG. 2.

In another example, the package clip 200 includes the receptacle guide 206. As previously described, the receptacle guide 206 includes one or more surfaces sized and shaped to engage with the receptacle 120 as the receptacle is inserted between the heat sink 106 and the substrate 210 for connection with the die 104 in a top side fashion such as along the package top side 114 shown in FIG. 1 (the top surface of the die 104 and the substrate underlying the heat sink 106). For instance, in one example the receptacle guide 206 includes one or more of lateral guide surfaces 1300 and one or more of bottom or top guide surfaces 1302. The lateral guide surfaces 1300 and the bottom guide surfaces 1302 in the example shown in FIG. 13A, B cooperate in sliding engagement with the corresponding portions of the receptacle body 900 to guide and align the receptacle body so the plug contacts 800 mate with the receptacle contacts 304 of the plug 118. The receptacle guide 206 formed along the edges of the side access port 110 thereby provides an alignment and guiding function to the receptacle 120 as the receptacle is inserted into the side access port 110.

In one example, the receptacle guide 206 includes a side access port length 1306, a side access port width 1308 and a side access port height 1310 corresponding to the dimensions provided for the receptacle 120 shown in FIG. 12. Stated another way, the side access port length 1306 and the receptacle length 1206 correspond while the side access port width 1308 and the receptacle width 1208 similarly correspond. In much the same fashion, the receptacle height 1210 and the side access port height 1310 correspond as well. By substantially matching these dimensions between the receptacle 120 and the side access port 110 the receptacle is received in sliding engagement within the receptacle guide 206 and guided and aligned with the plug 118.

As previously described the plug 118 includes plug terraces 300 while the receptacle 120 includes receptacle terraces 302 there along. By aligning these portions of the receptacle 120 with those of the plug 118 the stepped terraces are readily engaged with one another thereby arranging the corresponding contacts 800 and 304 of each of the terraces to similarly engage in an aligned and organized fashion.

In another example, package clip 200 shown in FIGS. 13A and 13B includes a second receptacle guide such as a receptacle guide 1312 (shown in phantom lines) provided on an opposed or another side of the package clip 200. A supplemental receptacle guide provides an additional means for connection of the die 104 for instance by way of a plug positioned along the substrate 210 with another component positioned on a board coupled with the package (the die 104). By providing a supplemental connection in this fashion increased data bandwidth capabilities of the die 104 are realized by way of a separate cable coupling with these components. The coupling of the die 104 includes but is not limited to electrical coupling by way of a bottom side access port 212 including the contact array 214 thereon (see FIG. 2) as well as connection by way of the side access port 110 and a supplemental side access port 1312 of the type described immediately above.

FIG. 14 shows a top view of the package assembly 100 in an assembled configuration with the receptacle 120 coupled with the plug 118 to form the assembled connector 102. In this example, the heat sink 106 is shown in phantom lines to correspondingly expose the substrate 210 as well as the connector 102 in the assembled configuration. As shown in FIG. 14 the heat sink 106 includes a heat sink perimeter 1402 and a heat sink overhang 1400 extending from the plug 118 to the heat sink perimeter 1402. As shown the receptacle 120 including the receptacle insertion arm 1200 has a receptacle length 1206 as shown in FIG. 12 substantially matching the heat sink overhang 1400 (optionally extending immediately beyond the perimeter 1402 to facilitate insertion and grasping of the receptacle insertion arm 1200). As previously described and shown in FIGS. 12, 13A and 13B the receptacle 120 including the receptacle insertion arm 1200 has a corresponding length, width and height 1206, 1208, 1210 that correspond to the side access port length 1306, side access port width 1308 and the side access port height 1310. The close dimensioning of these features allows for the aligned reception of the receptacle 120 relative to the plug 118. Stated another way, as the receptacle 120 is inserted into the side access port 110 the receptacle guide 206 including one or more of the lateral guide surfaces 1300 and the bottom guide surface 1302 shown in FIGS. 13A and 13B guide the receptacle 120 into coupling with the plug 118 so that the receptacle contacts 304 and the plug contacts 800 of the respective plug 118 and the receptacle 120 engage in a desired arrangement. In another example the receptacle terraces 302 correspond with the plug terraces 300 to align the contacts 304 and 800 and thereby further ensure that the contacts are coupled between the plug 118 and the receptacle 120 as desired. That is to say, the receptacle terraces 302 interfit with the plug terraces 300 to substantially ensure the contacts are engaged in the arrangement desired.

Referring back to FIG. 1, the side access port 110 is shown between the heat sink 106 and a portion of the die 104 such as the substrate 210 shown in FIG. 2. The distance between the heat sink 106 and the substrate 210, for instance the top surface of the substrate, in one example corresponds to the receptacle height 1210 shown in FIG. 12 as well as the side access port height 1310 shown in FIGS. 13A and 13B. That is to say, the receptacle guide 206 in one example uses at least a portion of the heat sink 106 and the substrate 210 (or a portion of the package clip 200 level or flush with the substrate 210) to guide at the receptacle 120 into engagement through the side access port 110 with the plug 118. The guided reception of the receptacle 120 with the plug 118 by way of any of the guide surfaces described herein whether between the heat sink 106 and the substrate 210 (or a bottom guide surface 1302) as well as the lateral guide surfaces 1300 of the package clip 200 ensures that the low profile receptacle 120 shown in FIG. 1 is correspondingly received and reliably engaged with the plug 118. That is to say the contacts on each of the rows of the respective terraces of the plug 118 and the receptacle 120 are affirmatively and reliably engaged despite the low profile of the connector 102 relative to the height between the heat sink 106 and the substrate 210.

The arrangement of the connector 102 including the receptacle 120 and the plug 118 having the stepped terraces 302, 300 as previously described herein allows for the coupling of the receptacle 120 and the plug 118 including a plurality of contacts to increase data bandwidth of the connector while each of the components has a low profile. Accordingly, these components are positionable between the heat sink overhang 1400 shown in FIG. 14 and the top surface of the substrate 210 shown in FIG. 2. The connector 102 allows for the coupling of the cable such as the cable 122 with the die 104 without removal of the heat sink 106 from the package assembly 100. That is to say, the heat sink 106 (in a preinstalled configuration with the package, such as the die 104 and the substrate 210) is not removed during assembly with the connector 102. Instead, the package assembly 100 is in one example coupled with the board for instance along a bottom side access port 212 as shown in FIG. 2 and then engaged in a supplemental connection through the connector 102 by insertion of the receptacle 120 between the heat sink overhang 1400 shown and the substrate 210 (FIG. 14). Dimensional considerations, for instance of the overall height of the package assembly 100 between the top surface of the heat sink 106 and the bottom surface of the substrate 210 (an overall package assembly height) are thereby maintained as the heat sink 106 coupled with the integrated heat spreader 208 (or the die) by way of thermal interface material remains coupled with the package in the factory provided configuration. Additionally, the supplemental connection provided by the connector 102 for instance horizontally and along the package top side 114 (e.g. at a package side 112 shown in FIG. 1) allows for in-the-field installation of the package assembly 100 and supplemental coupling of the package by way of the cable 122 with other components without removal of the heat sink 106 or removal of the package assembly 100 from a circuit board.

FIG. 15 shows one example of a method 1500 for interconnecting a package along a top side of a package. In describing the method 1500 reference is made to one or more components, features, functions and the like described herein. Where convenient reference is made to the components and features with reference numerals. Reference numerals provided are exemplary and are not exclusive. For instance, the features, components, functions and the like described in the method 1500 include, but are not limited to, the corresponding numbered elements, other corresponding features described herein (both numbered and unnumbered) as well as their equivalents.

At 1502 the method 1500 includes installing the package (e.g., an assembly including a die 104 on a substrate 210) in a socket 108. In one example the package includes a package assembly 100 having a die 104 coupled along a substrate 210 (FIG. 2) and a heat sink 106 coupled over the die 104. In one example, the heat sink 106 is coupled with the die 104 with a package clip 200 that couples the heat sink 106 and a substrate 210 of the die 104.

At 1504 a connector, such as the connector 102, is connected at a side access port 110 of the package. The side access port 110 is formed between the heat sink 106 and the substrate 210 on a top side of the package, such as the package top side 114, shown in FIG. 1. In one example, the connector 102 when assembled is positioned between a heat sink overhang 1400 shown in FIG. 14 and the substrate 210. Stated another way, the connector 102 has a low-profile, for example by virtue of having two or more stepped terraces such as the terraces 300, 302 on the respective receptacle and plug 120, 118, to facilitate the coupling of a plurality of contacts in various rows within the limited space provided between the heat sink 106 and the substrate 210.

In one example, connecting the connector 102 includes inserting a receptacle, such as the receptacle 120 previously shown in FIG. 1 coupled with a cable 122 (e.g. a micro coaxial cable, optical cable, ribbon cable and the like) into the side access port 110. In another example connecting the connector 102 includes engaging plug contacts 800 on two or more receptacle terraces 302 of the receptacle 120 with receptacle contacts 304 along two or more plug terraces 300 of the plug 118. Optionally, the plug 118 is coupled with the substrate 210 at the side access port 110, for instance at a package side 112. In contrast, the receptacle 120 is coupled with the cable 122 as described above. In another example, the receptacle 120 and the plug 118 are reversed. That is to say, the plug 118 is coupled with the cable 122 and the receptacle 120 is in turn coupled with the substrate 210 of the die 104.

Several options for the method 1500 follow. In one example, installing the package in the socket 108 includes connecting the package to a circuit board underlying the socket 108. In one example the package includes a contact array, such as the contact array 214 shown in FIG. 2 on a package bottom side 116 of the substrate 210.

In another example, connecting the connector 102 at the side access port 110 includes interfitting the two or more receptacle terraces 302 of the receptacle 120 with the two or more plug terraces 300 of the plug 118. Stated another way, the terraces have corresponding shapes and thereby engage in an interfitting relationship when coupled together for instance as the receptacle 120 is delivered through the side access port 110. In another example, connecting the connector 102 at the side access port 110 includes guiding the receptacle (or in a converse arrangement the plug) with the receptacle guide 206 between the substrate 210 and a heat sink overhang 1400 of the heat sink 106. That is to say, in one example the receptacle guide 206 includes one or more of a bottom guide surface 1302 or lateral guide surfaces 1300 of the package clip 200, a portion of the substrate 210 or the bottom surface of the heat sink, such as the heat sink overhang 1400. Optionally, guiding the receptacle 120 with the receptacle guide 206 includes guiding with the receptacle guide 206 formed in a package clip 200 including for instance the arrangement shown in FIGS. 13A and 13B.

In still another example, the method 1500, for instance the portion of the method including connecting the connector 102, includes connecting the connector 102 while the heat sink 106 is coupled with the package, such as the die 104. As previously described herein, the heat sink 106 in at least one example has a heat sink perimeter 1402 that presents a heat sink overhang 1400 extending beyond the perimeter of the corresponding die 104 positioned underneath. That is to say, the side access port 110 extends underneath the heat sink overhang 1402 and above the substrate 210. In such an example the method 1500 includes connecting the connector, such as the receptacle 120 through the side access port 110, for instance by insertion of the receptacle 120 with the receptacle insertion arm 1200 through the side access port 110 (See FIG. 12). In one example, the receptacle guide 206 guides the receptacle 120 through the side access port underneath the heat sink overhang 1402 to align and guide the plug contacts 800 to the receptacle contacts 304 of the plug 118.

In yet another example, the method 1500 further comprises connecting a second connector at a second side access port, such as the side access port 1312 shown in FIG. 13A. In one example the second side access port 1312 is formed between the heat sink 106 and the substrate 210 on the package top side 114 previously shown in FIG. 1 in a manner similar to the side access port 110 described herein.

As previously described herein, in one example connecting the connector 102 includes pushing the receptacle 120 through the side access port 110 for instance, according to the alignment provided by the receptacle guide 206 to the receptacle 120 with the receptacle insertion arm 1200 previously shown in FIG. 12. The receptacle insertion arm 1200 extends from a receptacle body 900 having two or more of the receptacle terraces 302 thereon. In another example the method 1500 includes retaining two or more cables, such as ribbon cables, along the receptacle insertion arm for instance by way of one or more cable clips 1204 extending along the receptacle insertion arm 1200. Retaining the two or more cables decreases the interface stress between the two or more cables and a plurality of receptacle pins including cable contacts 1000 positioned along the receptacle body 900 of the receptacle 120.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, disclosed subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

What is claimed is:

1. A connector and package assembly comprising:
   a package including a die coupled along a substrate, the package includes:
      a side access port on a side of the package, and
      a contact array on a bottom of the package, the contact array arranged for coupling with a socket;
   a heat sink coupled over the die, and the side access port is between the heat sink and the substrate; and
   a connector including:
      a plug coupled with one or more of the package or substrate at the side access port, the plug having a plurality of contacts provided on two or more plug terraces, the two or more plug terraces are in a stepped arrangement, and
      a receptacle arranged for coupling with the plug and a cable, the receptacle having a plurality of contacts provided on two or more receptacle terraces, the two or more receptacle terraces are in a corresponding stepped arrangement to the two or more plug terraces.

2. The connector and package assembly of claim 1 comprising a package clip coupling the heat sink with the substrate, the package clip includes a receptacle guide having one or more guide surfaces and the side access port is within the receptacle guide, the plug is positioned within the receptacle guide, and the receptacle guide is arranged to align and guide coupling of the receptacle with the plug.

3. The connector and package assembly of claim 1, the one or more guide surfaces include lateral guide surfaces, and a side access port width and a receptacle width correspond to a distance between the lateral guide surfaces.

4. The connector and package assembly of claim 1, a side access port height and a receptacle height correspond to a distance between a heat sink overhang of the heat sink and a topside substrate face.

5. The connector and package assembly of claim 1, a side access port length and a receptacle length correspond to a distance from the plug to an edge of the heat sink overhang.

6. The connector and package assembly of claim 5, the receptacle includes a receptacle insertion arm extending from a receptacle body having the two or more receptacle terraces, the receptacle insertion arm extending the respective side access port length and the receptacle length.

7. The connector and package assembly of claim 1, the side access port, the plug and the receptacle are arranged for horizontal coupling on the side of the package.

8. The connector and package assembly of claim 1, one of the plug or the receptacle is a plug and the other of the receptacle or the plug is a plug.

9. A method of connecting a package comprising:
   installing a package in a socket; and
   connecting the package with a work piece through a side access port and a contact array of the package, connecting including:
      inserting a receptacle coupled with a cable into the side access port, the side access port between a heat sink and a substrate of the package,
      engaging plug contacts along two or more receptacle terraces of the receptacle with receptacle contacts along two or more plug terraces of a plug, the plug at the side access port, and
      engaging the contact array with a circuit board of the work piece, the contact array on a bottom side of the package.

10. The method of claim 9 comprising guiding the receptacle with a receptacle guide between the substrate and a heat sink overhang of the heat sink.

11. The method of claim 9, connecting the package with the work piece through the side access port includes interfitting the two or more receptacle terraces of the receptacle with the two or more plug terraces of the plug.

12. The method of claim 9, connecting the package includes pushing the receptacle into the side access port with a receptacle insertion arm extending from a receptacle body of the receptacle.

13. The method of claim 12 comprising retaining two or more cables along the receptacle insertion arm, retaining the two or more cables decreasing interface stress between the two or more cables and a plurality of cable contacts of the receptacle.

14. The method of claim 9, connecting the package includes connecting the connector while the heat sink is coupled with the package, and the heat sink overhangs the package.

15. The method of claim 9 connecting the package includes inserting a second receptacle coupled with a second cable into a second side access port, the second side access port between the heat sink and the substrate of the package.

* * * * *